(12) United States Patent
Yin et al.

(10) Patent No.: US 6,437,720 B1
(45) Date of Patent: Aug. 20, 2002

(54) CODE INDEPENDENT CHARGE TRANSFER SCHEME FOR SWITCHED-CAPACITOR DIGITAL-TO-ANALOG CONVERTER

(75) Inventors: Guangming Yin, Foothill Ranch; Bo Zhang, Las Flores, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/785,690

(22) Filed: Feb. 16, 2001

(51) Int. Cl.[7] .............................................. H03M 1/66
(52) U.S. Cl. ...................... 341/150; 341/144; 341/172
(58) Field of Search ................................ 341/144, 150, 341/172

(56) References Cited

U.S. PATENT DOCUMENTS

| | | | |
|---|---|---|---|
| 4,370,632 A | 1/1983 | Allgood et al. ............. 333/173 |
| 5,162,801 A | 11/1992 | Powell et al. ............... 341/150 |
| 5,245,344 A | 9/1993 | Sooch ......................... 341/150 |
| 5,363,102 A | * 11/1994 | Ferguson, Jr. ............... 341/172 |
| 5,412,387 A | 5/1995 | Vincelette et al. .......... 341/150 |
| 5,451,950 A | 9/1995 | Vincelette et al. .......... 341/150 |
| 5,563,597 A | * 10/1996 | McCartney .................. 341/150 |
| 5,600,320 A | 2/1997 | Wilson et al. ............... 341/144 |
| 5,614,864 A | 3/1997 | Stubbe et al. ................. 330/69 |
| 5,703,589 A | * 12/1997 | Kalthoff et al. ............. 341/172 |
| 5,719,576 A | * 2/1998 | Draxelmayr ................. 341/150 |
| 5,729,232 A | * 3/1998 | Fujimori ...................... 341/172 |
| 5,818,377 A | * 10/1998 | Wieser ........................ 341/144 |
| 5,892,473 A | * 4/1999 | Shin ............................ 341/150 |
| 5,990,819 A | * 11/1999 | Fujimori ...................... 341/150 |
| 6,144,331 A | * 11/2000 | Jiang ........................... 341/172 |
| 6,271,784 B1 | * 8/2001 | Lynn et al. .................. 341/150 |

\* cited by examiner

Primary Examiner—Michael Tokar
Assistant Examiner—Khai Nguyen
(74) Attorney, Agent, or Firm—Foley & Lardner

(57) ABSTRACT

A switched-capacitor digital-to-analog converter circuit is disclosed. The switched-capacitor digital-to-analog converter circuit includes crossing switches for each capacitor branch, the crossing switches are used to eliminate cross interference between digital-to-analog converter blocks sharing the same reference voltages.

20 Claims, 3 Drawing Sheets

CODE INDEPENDENT CHARGE TRANSFER SCHEME FOR SWITCHED-CAPACITOR DIGITAL-TO-ANALOG CONVERTER

FIELD OF THE INVENTION

The disclosure relates to switched-capacitor digital-to-analog (DAC) converter circuitry in which crossing switches for each capacitor are used thereby eliminating any cross interference between blocks sharing the same reference voltages.

BACKGROUND OF THE INVENTION

Switched-capacitor digital-to-analog (DAC) converters are popular blocks in mixed-signal chips. Differential structures are typically used in switched-capacitor DAC to suppress noise and odd order harmonic distortion.

Referring now to FIG. 1, as is conventional for a switched-capacitor circuit, control signals $\Phi_1$ and $\Phi_2$ (timing signals) operate in two non-overlapping time intervals (or clock phases).

With each input capacitor's equal size (a m bit DAC has $2^m-1=n$ unit element capacitors) or multiple of unit size capacitor for better matching, a typical implementation of a fully differential switched-capacitor DAC is depicted in FIG. 2, in which a prior art switched-capacitor DAC system is shown including a DAC 10 and an integrator 20. During clock phase $\Phi_1$, DAC 10 samples a reference voltage and during clock phase $\Phi_2$ transfers charge to integrator 20 together with negative reference $v_{ref_n}$ 12 ($-v_{ref}$) and positive reference $v_{ref_p}$ 11 ($+v_{ref}$). Reference voltages $v_{ref_p}$ 11 and $v_{ref_n}$ 12 may be considered as input voltages to DAC 10. Integrator 20 includes an operational amplifier (op amp) 21, a first integrator capacitor 22 connected between non-inverting output lead 23 and inverting input lead 24, and a second integrator capacitor 25 connected between inverting output lead 26 and non-inverting input lead 27.

Switched-capacitor DAC 10 includes input lines 11 and 12 receiving the positive and negative terminals of a reference voltage $v_{ref}$. A first set of input capacitors 13 are coupled to input lines 11 and 12 through a first switching circuit 14 and to the input leads 24 and 27 of op amp 21 through a second switching circuit 15. A second set of input capacitors 16 as part of a fully differential structure are similarly coupled to input lines 11 and 12 through first switching circuit 14 and to input leads 24 and 27 of op amp 21 through second switching circuit 15. Capacitors 13 and 16 sample (i.e., are charged by) the reference voltage $v_{ref}$ through switching circuit 14 and transfer charge to capacitors 22 and 25 through switching circuit 15. The values of capacitors 13 and 16 are preferably equal as are the values of capacitors 22 and 25.

Depending on the individual digital code signal $y_i$ and $y_{ib}$ where $y_{ib}$ is the complement of $y_i$, i=1, 2, ... n. If all $y_i$ equal to 1 represents maximum value of DAC and all $y_i$ equal to 0 represents minimum value of DAC. To an m bit DAC, $y_i$ and $y_{ib}$ can be derived from a binary (or 2's complementary) code to thermometer code converter. Switching circuit 14 includes switches 17 which are controlled by combination logic $\Phi_1$ $y_i+\Phi_2$ $y_{ib}$ of (timing signal) $\Phi_1$, $\Phi_2$ and digital code $y_i$ and $y_{ib}$, where i=1,2, ..., n and the switches 18 which are controlled by a different way of $\Phi_1$ $y_i+\Phi_2$ $y_{ib}$ of $\Phi_1$, $\Phi_2$ and digital code $y_i$ and $y_{ib}$, where i=1,2, ..., n. Switching circuit 15 includes switches 19 and 30, switches 19 being controlled by signal $\Phi_1$ alone and switches 30 being controlled by signals $\Phi_2$ alone see FIG. 1.

Switching circuit 14 includes a first set of switches 17 connected between input lines 11 and the left plate of capacitors 13. A second switch 18 is connected between input lines 12 and the left plate of capacitor 13. A set of switches 17 are connected between input lines 12 and the left plate of capacitors 16. A set of switches 18 are connected between input line 11 and the left plate of capacitors 16. Switching circuit 15 includes a first switch 19 connected between the right plate of capacitors 13 and the inverting input lead 24 of op amp 21 and similarly a second switch 19 connected between the right plate of capacitors 16 and the non-inverting input lead 27 of op amp 21. A switch 30 is connected between the right plate of capacitors 13 and the non-inverting input lead 24 of op amp 21. Similarly, a switch 30 is connected between the right plate of capacitor 16 and the non-inverting input lead 27 of op amp 21. Switches 19 are controlled by a control signal $\Phi_1$ while switches 30 are controlled by a control signal $\Phi_2$.

As should be readily understood by those skilled in the art, input capacitors 13 and 16 operate to sample reference voltages 11 and 12 through switching circuit 14 and transfer charge to integrating capacitors 22 and 25 through switching circuit 15. The arrangement of input capacitors enables reference voltages to be sampled during both time intervals and charge to be transferred during both time intervals. The timing diagram of FIG. 1 assumes that the digital code signal $y_i$ remains stable during a single period of signals $\Phi_1$ and $\Phi_2$. The DAC of FIG. 2 operates effectively to draw charge from references $v_{ref_p}$ and $v_{ref_n}$ and the charge depends on the previous digital code. Since references $v_{ref_p}$ and $v_{ref_n}$ always have certain output impedance, the derivative of the output signals 32 and 33 will ride on the references, thereby creating cross coupling and interference with other circuit blocks sharing the same references.

Accordingly, there is a need for a code-independent charge transfer scheme for switched-capacitor digital-to-analog converters which reduces complexity of the voltage references and achieves signal-independent charge drawn from the reference, without the use of multiple references or dummy circuitry or without using references with very low output impedance.

SUMMARY OF THE INVENTION

An exemplary embodiment of the present invention relates to a switched-capacitor DAC system configured to receive a digital code signal. The DAC system includes a first switched-capacitor branch 80 and a second switched-capacitor branch which are dependent on the digital code signals. Further, the DAC system includes another switching circuit that includes a first and second sampling switch and a first and second discharge switch. The first and second sampling switches operate substantially in unison to sample signals from the first branch circuit and the second branch circuit and provide an output to an integrator.

Another exemplary embodiment of the present invention relates to a switched-capacitor DAC system configured to receive a digital code signal. The DAC system includes at least one digital code dependent switching circuit, receiving the digital code signal. The DAC system also includes at least one reference input switching circuit. Then the at least one reference input switching circuit isolates from the digital code dependent switching circuit by at least one capacitor.

Yet another exemplary embodiment of the present invention relates to a switched-capacitor DAC system configured to receive a digital code signal having an integrator circuit including an op amp having first and second input leads, first and second output leads, and first and second integrator capacitors respectively connected between the first and second input leads and the first and second output leads. The DAC system includes a first switching circuit coupled to a reference input. The first switching circuit output is dependent on the digital code signal. The DAC system also includes at least one first input capacitor to be charged through the reference inputs and the first switching circuit. Further, the DAC system includes a second switching circuit coupled to the reference input. The first switching circuit output is dependent on the digital code signal. Further still, the DAC system includes at least one second input capacitor to be charged by the output of the second switching circuit. Yet further still, the DAC system includes a third switching circuit that includes at least one switch responding according to the digital code signal and at least one switch responding to the complement of the digital code signal. The third switching circuit is coupled to the output of the first switching circuit through at least one capacitor. Yet further still, a fourth switching circuit includes at least one switch responsive to the digital code signal and at least one switch responsive to the complement of the digital code signal. The fourth switching circuit is coupled to the output of the second switching circuit through at least one capacitor. Yet further still, a fifth switching circuit includes a first switch coupled to the third switching circuit and receiving signals according to the digital code and the first switch coupled to the fourth switching circuit configured to receive signals according to the complement of the digital code. The fifth switching circuit also including a second switch coupled to the third switching circuit and receiving a signal according to the complement of the digital code and the second switch coupled to the fourth switching circuit and receiving a signal according to the digital code. The fifth switching circuit being coupled to the input of the integrator circuit.

BRIEF DESCRIPTION OF THE DRAWINGS

The invention will become more fully understood from the following detailed description, taken in conjunction with the accompanying drawings, wherein like reference numerals refer to like elements, in which.

DETAILED DESCRIPTION OF EXEMPLARY EMBODIMENTS

Figure 3:
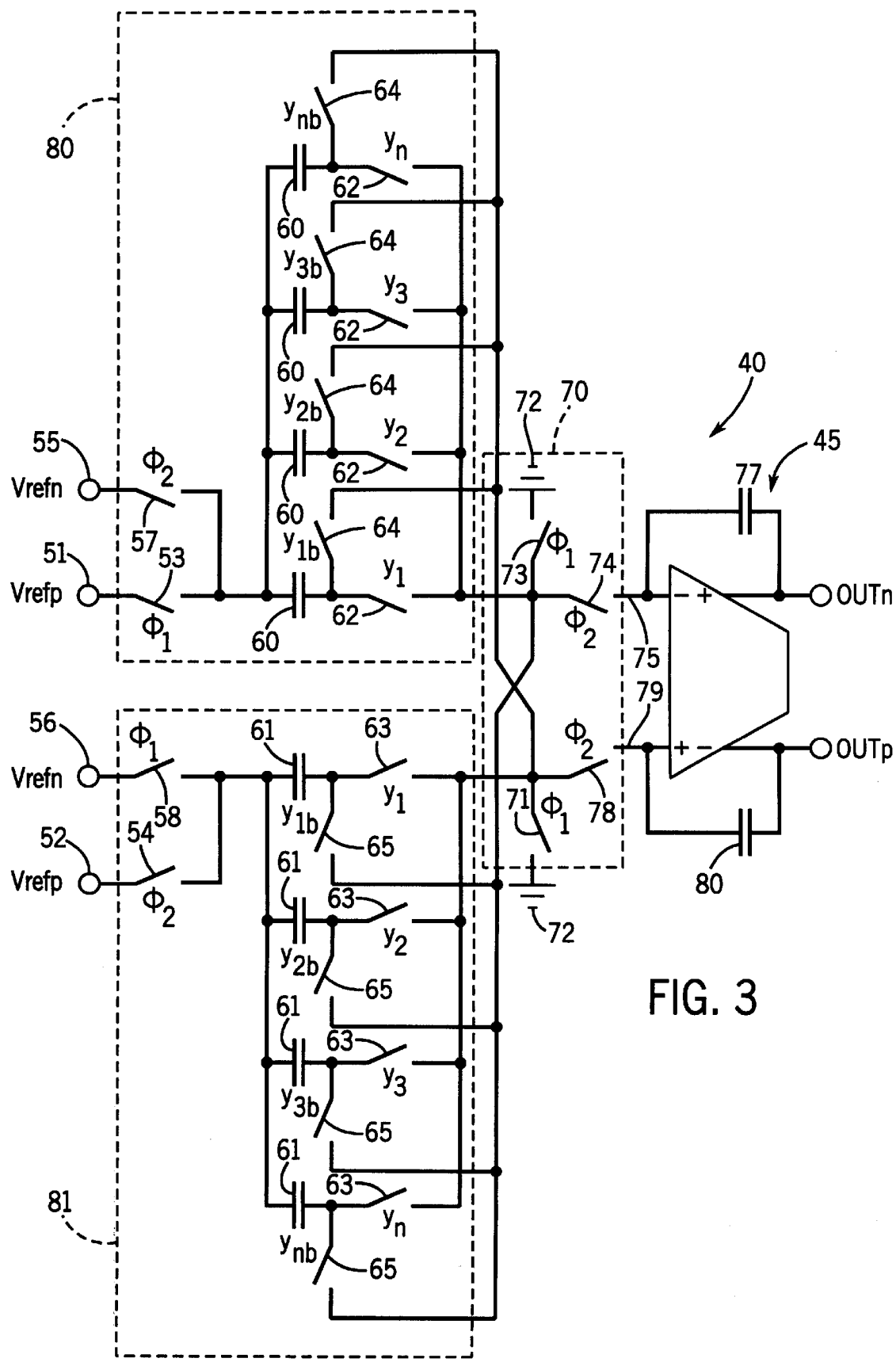
FIG. 3 is an inverted switched-capacitor digital-to-analog converter which draws code-independent charge from references.

Referring to FIG. 3, a digital-to-analog converter 40 plus integrator 45, which has two crossing switches 74 and 78 for capacitors 77 and 80 respectively, are placed on the op amp side of converter 40 controlled by clock phase $\Phi_2$. Because, in each clock period, each reference will draw the same charge from the DAC switching operation, cross interference between blocks sharing the same references will be eliminated.

Figure 1:
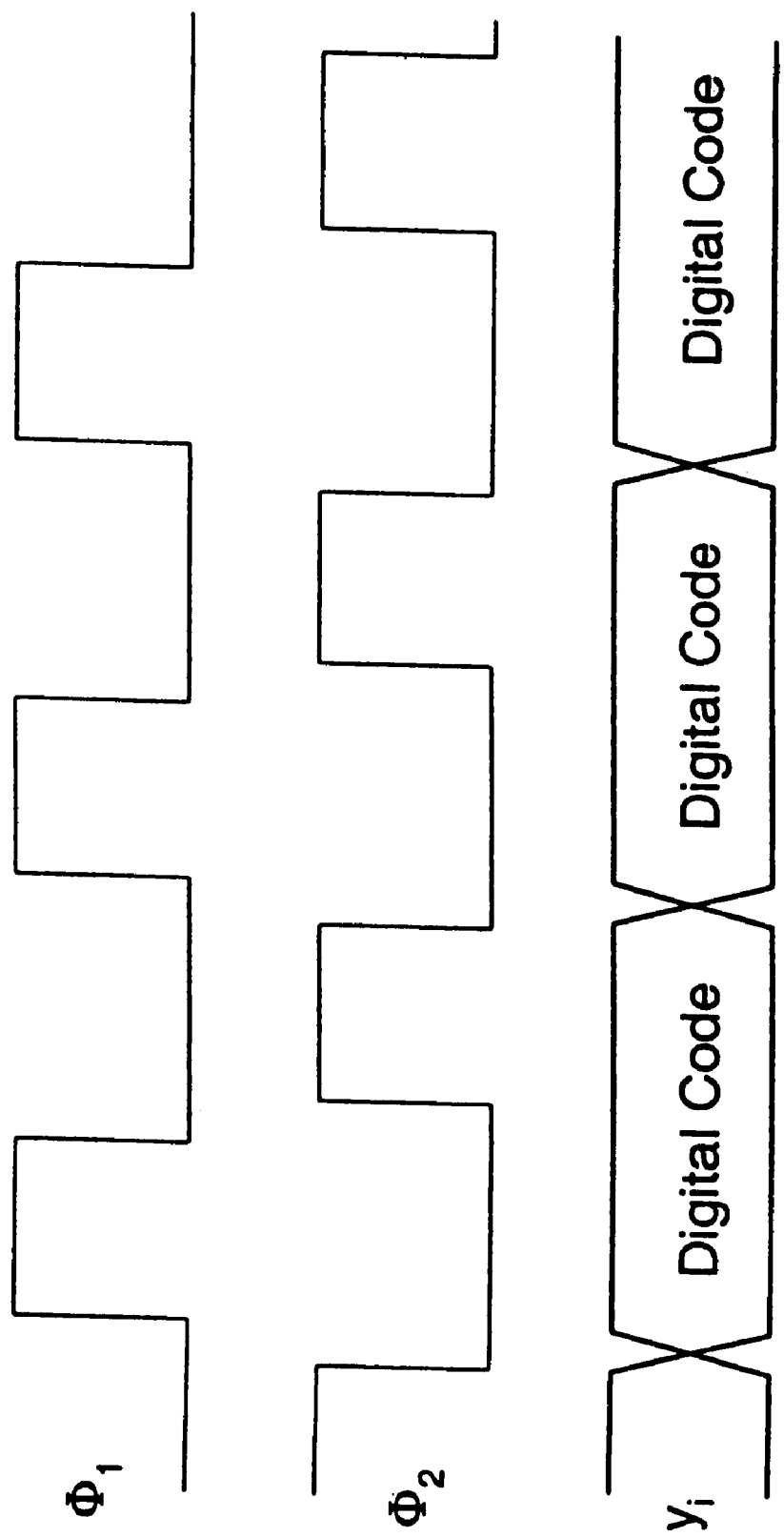
FIG. 1 is a timing diagram of clock phases $\Phi_1$, $\Phi_2$ and digital code $y_i$, where i=1, . . . ,n.
Figure 2:
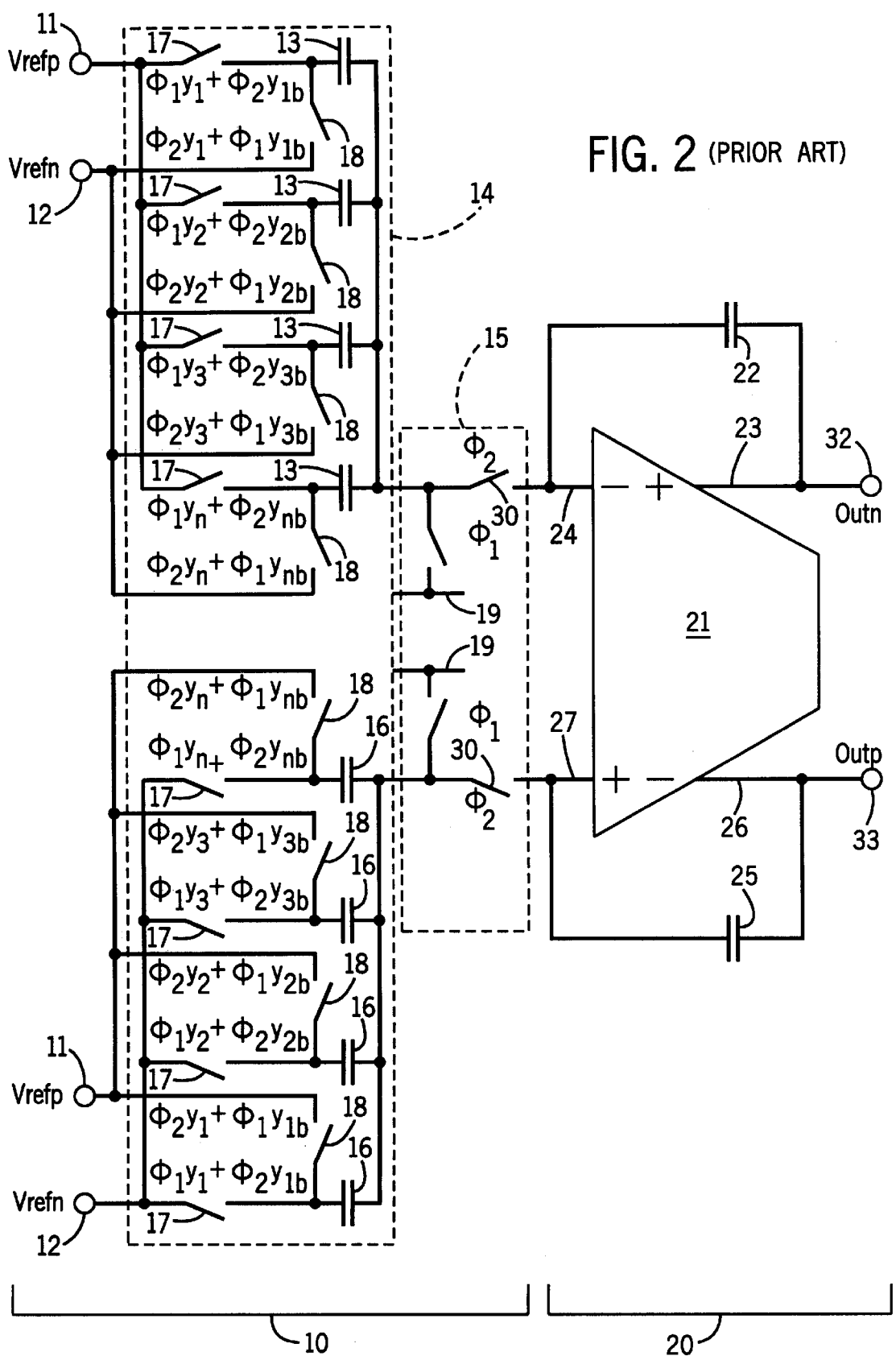
FIG. 2 is a circuit diagram of a switched-capacitor digital-to-analog converter of the prior art.

In operation, a reference signal $V_{ref_p}$ is supplied to inputs 51 and 52 which are coupled to switches 53 and 54 respectively and signal $v_{ref_n}$ are applied to inputs 55 and 56 which are coupled to switches 57 and 58 respectively. Switches 53 and 58 are controlled by clock phase $\Phi_1$ while switches 54 and 57 are controlled by clock phase $\Phi_2$ (clock phases see FIG. 1). Switches 57 and 53 (making up a first input or a first reference switching circuit) are coupled to the left plate of capacitors 60 while switches 58 and 54 (making up a second input or a second reference switching circuit) are coupled to the left plate of capacitors 61. Therefore, dependent on the states of switches 57 or 53, capacitors 60 are charged accordingly. Similarly, depending on the states of switches 58 and 54, capacitors 61 are charged according to input references $v_{ref_n}$ and $v_{ref_p}$.

A digital code signal is applied to switches 62 and 63, designated by $y_i$, where i=1,2, . . . , n. Accordingly, switches 64 and switches 65 receive the complement of the digital code, designated as $y_{ib}$, where $y_{ib}$ is the complement of $y_i$ and i=1,2, . . . , n. A second switching circuit 70 includes a switch 71 having an input coupled to the right hand plate of capacitors 60 according to digital code $y_{ib}$, and an input coupled to the right hand plate of capacitor 61 according to digital code complement $y_i$. Switch 71 is controlled by clock phase $\Phi_1$ and is coupled to ground 72. Switching circuit 70 also includes a switch 73 that is coupled on its input side to the right hand plate of capacitors 61 according to the digital code $y_{ib}$ and to the right hand plate of capacitors 60 according to digital code complement $y_i$ and is coupled to ground 72 on the output side. Switch 73 is controlled by clock phase $\Phi_1$ and is coupled to ground 72. Switching circuit 70 also includes a switch 74, controlled by clock phase $\Phi_2$ that is coupled, on the input side, to the right hand plate of capacitors 60 according to digital code $y_i$ and to the right handplate of capacitors 61 according to digital code complement $y_{ib}$, and coupled to inverting input lead 75 to op amp 76 and to integrating capacitor 77. Switching circuit 70 further includes switch 78, coupled to the right hand plate of capacitors 60 according to digital code complement $y_{ib}$ and the right handplate of capacitors 61 according to digital code $y_i$, on the input side and to non-inverting input 79 of op amp 76 and to integrating capacitor 80 on the output side.

Accordingly, switch 74 receives a $v_{ref_n}$ signal according to digital code according to switches 62 and 57 and $v_{ref_p}$ according to digital code complement determined by switches 65 and 54 in complementary branch 81. Conversely, switch 78 receives a signal, when $\Phi_2$ is high from $v_{ref_n}$ based on complementary digital code switch 64 and switch 57 in branch 80 and $v_{ref_p}$ according to digital code switch 63 and switch 54 in branch 80.

According to scheme, charges drawing from references 51, 52, 55, and 56 are same during each clock period. Therefore, charge drawing from references 51, 52, 55, and 56 are completely independent of the digital code according to switches 62, 63, 64, and 65. Since other blocks on the same die can share the same references without concerning interfering from each other, this results in the saving of power, die area, and/or external components. Therefore, by utilizing the structure depicted in FIG. 3, isolation between each and every digital-to-analog converter block using this structure is accomplished.

Switching circuits 70, 80 and 81 are configured to provide a differential signal to integrator 45 of DAC 40 in such a manner as to allow isolation of reference inputs 51, 52, 55, and 56 from the digital code inputs. However, it should be noted that although switching circuit 70 is an effective structure for carrying out the functions required for isolation, other circuits may be applied without departing from the scope of the invention.

It is understood that, while the detailed drawings and specific examples given describe exemplary embodiments of the present invention, they are for the purposes of illustration only. The apparatus and method in the invention is not limited to the precise details, circuitry, and functioning disclosed. For example, although particular circuitry configurations are shown, other paths which may be functionally equivalent may be made as part of the scope of the invention. Accordingly, various changes may be made without departing from the scope of the present invention as defined in the following claims.

What is claimed is:

1. A switched-capacitor DAC system configured to receive a digital code signal, the DAC system comprising:
   a first switched capacitor branch circuit including a reference switching circuit that is independent of the digital code signal and that is switched according to a first and a second timing signal;
   a second branch circuit including a reference switching circuit that is independent of the digital code signal and that is switched according to the first and the second timing signal; and
   a third switching circuit including a first and second sampling switch and a first and second discharge switch, the first and second sampling switches operating substantially in unison according to the second timing signal to sample signals from the first branch circuit and the second branch circuit and providing an output to an integrator and the first and second discharge switches operating substantially in unison according to the first timing signal.

2. The switched capacitor DAC system of claim 1, wherein the first branch circuit receives a positive reference signal and a negative reference signal.

3. The switched capacitor DAC system of claim 2, wherein the second branch circuit receives a positive reference signal and a negative reference signal.

4. The switched capacitor DAC system of claim 3, wherein the first branch and the second branch switch between the positive reference and the negative reference according to two different timing signals.

5. The switched capacitor DAC system of claim 1, wherein the reference switching circuits of the first and second branches are isolated from at least one code dependent circuit, by at least one capacitor.

6. The switched capacitor DAC system of claim 1, wherein the integrator includes an op amp circuit.

7. The switched capacitor DAC system of claim 6, wherein the integrator includes at least one capacitor.

8. The switched capacitor DAC system of claim 1, wherein the first and second branch circuits each include more than one capacitor.

9. A switched-capacitor DAC system configured to receive a digital code signal, the DAC system comprising:
   at least one digital code dependent switching circuit, receiving the digital code signal;
   at least one reference input switching circuit, the at least one reference input switching circuit isolated from the digital code dependent switching circuit by at least one capacitor and the at least one reference input switching circuit being switched according to a first and a second timing signal; and
   an output switching circuit including a first and second sampling switch and a first and second discharge switch, the first and second sampling switches operating substantially in unison according to the second timing signal to sample signals from the at least one reference input switching circuit and providing an output to an integrator and the first and second discharge switches operating substantially in unison according to the first timing signal.

10. The switched capacitor DAC system of claim 9, wherein the at least one reference input switching circuit receives a positive reference signal and a negative reference signal.

11. The switched capacitor DAC system of claim 10, wherein the at least one reference input switching circuit switches between the positive reference and the negative reference according to two different timing signals.

12. The switched-capacitor DAC system of claim 9, wherein the at least one digital code dependent switching circuit is coupled to an integrator.

13. The switched-capacitor DAC system of claim 12, wherein the integrator includes an op amp circuit.

14. The switched capacitor DAC system of claim 13, wherein the integrator includes at least one capacitor.

15. A switched-capacitor DAC system configured to receive a digital code signal having an integrator circuit including an op amp having first and second input leads, first and second output leads, and first and second integrator capacitors respectively connected between the first and second input leads and the first and second output leads, the DAC system comprising:
   a first switching circuit coupled to a reference input, the first switching circuit being controlled by a first and a second control signal;
   at least one first input capacitor to be charged through the reference inputs and the first switching circuit;
   a second switching circuit coupled to the reference input, the first switching circuit being controlled by the first and the second control signal;
   at least one second input capacitor to be charged by the output of the second switching circuit;
   a third switching circuit including at least one switch responding according to the digital code signal and at least one switch responding to the complement of the digital code signal, the second switching circuit being coupled to the output of the first switching circuit through at least one capacitor;
   a fourth switching circuit including at least one switch responsive to the digital code signal and at least one switch responsive to the complement of the digital code signal, the fourth switching circuit being coupled to the output of the second switching circuit through at least one capacitor;
   a fifth switching circuit including a first switch coupled to the third switching circuit and receiving signals according to the digital code and the first switch coupled to the fourth switching circuit and configured to receive signals according to the complement of the digital code, the fifth switching circuit also including a second switch coupled to the third switching circuit and receiving a signal according to the complement of the digital code and the second switch coupled to the fourth switching circuit and receiving a signal according to the digital code, the fifth switching circuit being coupled to the input of the integrator circuit, the fifth switching circuit being controlled by the first and the second control signal.

16. The switched-capacitor DAC system of claim 15, wherein the integrator includes at least one capacitor.

17. The switched-capacitor DAC system of claim 15, wherein the first switching circuit is driven by at least two timing signals.

18. The switched-capacitor DAC system of claim 15, wherein the second switching circuit is driven by at least two timing signals.

19. The switched-capacitor DAC system of claim 15, wherein the fifth switching circuit is driven by at least two timing signals.

20. The switched-capacitor DAC system of claim 19, wherein the first and second switching circuits are each driven by at least two timing signals.

* * * * *